(12) United States Patent
Hu et al.

(10) Patent No.: US 11,596,068 B2
(45) Date of Patent: Feb. 28, 2023

(54) DUAL-LAYER DISPLAY ASSEMBLY AND DISPLAY DEVICE

(71) Applicant: HKC CORPORATION LIMITED, Shenzhen (CN)

(72) Inventors: Xiaogang Hu, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 17/198,266

(22) Filed: Mar. 11, 2021

(65) Prior Publication Data
US 2022/0087021 A1    Mar. 17, 2022

(30) Foreign Application Priority Data

Sep. 14, 2020    (CN) .......................... 202010960511.3

(51) Int. Cl.
| | |
|---|---|
| H05K 1/14 | (2006.01) |
| G02F 1/1335 | (2006.01) |
| G02F 1/1345 | (2006.01) |
| G02F 1/1347 | (2006.01) |
| G09G 3/36 | (2006.01) |

(52) U.S. Cl.
CPC ........... H05K 1/144 (2013.01); G02F 1/1345 (2013.01); G02F 1/1347 (2013.01); G02F 1/133514 (2013.01); G02F 1/133528 (2013.01); G09G 3/36 (2013.01); *G02F 2202/28* (2013.01); *H05K 2201/042* (2013.01); *H05K 2201/10136* (2013.01)

(58) Field of Classification Search
CPC ............... G02F 1/1347; G02F 1/13471; G02F 1/13473; G02F 1/13475; G02F 1/13476; G02F 1/13478; G09G 2300/023; H05K 1/144; H05K 2201/042; H05K 2201/10568
See application file for complete search history.

(56) References Cited

U.S. PATENT DOCUMENTS

2019/0196263 A1\* 6/2019 Chen .................. G02F 1/13471
2020/0333654 A1\* 10/2020 Katagiri ............ G02F 1/133345

FOREIGN PATENT DOCUMENTS

CN            210270437 U      4/2020

\* cited by examiner

*Primary Examiner* — Jessica M Merlin

(57) ABSTRACT

The application discloses a dual-layer display assembly and a display device. The dual-layer display assembly includes a first display screen, a second display screen, a first print circuit board, a second print circuit board and a fixing structure, where the second display screen is arranged in layers with the first display screen; the first print circuit board drives the first display screen; the second print circuit board drives the second display screen; and the fixing structure connects and fixes the first print circuit board and the second print circuit board.

12 Claims, 3 Drawing Sheets

DUAL-LAYER DISPLAY ASSEMBLY AND DISPLAY DEVICE

The present application claims priority to the Chinese Patent Application No. 202010960511.3, filed Sep. 14, 2020, which is hereby incorporated by reference herein as if set forth in its entirety.

TECHNICAL FIELD

The present application relates to the field of display technologies, particularly to a dual-layer display assembly and a display device.

BACKGROUND

The statements herein merely provide background information related to the present application and do not necessarily constitute the conventional art.

With the development of liquid crystal display panels, display devices having many advantages, such as thin body, power saving, and free of radiation, are widely used. Most display devices are backlight type display devices, which include a display assembly (including a display panel and a backlight module). The working principle of display panels is to place liquid crystal molecules in two parallel substrates and apply driving voltage on the two substrates to control the rotation direction of the liquid crystal molecules, so as to refract the light of the backlight modules to generate a picture.

However, as people's pursuit of quality becomes higher and higher, the relatively lower display contrast ratio and the like of the existing display devices are difficult to meet the pursuit of higher display quality of some people, and those skilled in the art propose the concept of a layered screen or a dual-layer screen, with the dual-layer screen provided with two print circuit boards.

However, during the adhesive dispensing process, the existing production line can only adsorb one print circuit board, leaving the other print circuit board in a drooping state, which when lasts for long leads to the phenomenon of fatigue damage.

SUMMARY

The purpose of the present application is to provide a dual-layer display assembly and a display device, which can improve the stability of a print circuit board.

The present application discloses a dual-layer display assembly including a first display screen, a second display screen arranged in layers with the first display screen, a first print circuit board connected to the first display screen and configured for driving the first display screen, a second print circuit board connected to the second display screen and configured for driving the second display screen, and a fixing structure connecting and fixing the first print circuit board and the second print circuit board; where the first print circuit board and the second print circuit board are arranged in parallel, and the fixing structure is arranged between the first print circuit board and the second print circuit board to connect and fix the first print circuit board and the second print circuit board.

Optionally, the fixing structure includes a double-sided back adhesive thermal paste, the double-sided back adhesive thermal paste adheres the first print circuit board to the second print circuit board to fix them.

Optionally, the fixing structure includes a double-sided fixing structure including a first limiting groove configured for limiting and fixing the first print circuit board, a second limiting groove configured for limiting and fixing the second print circuit board, and a spacing plate arranged between the first limiting groove and the second limiting groove; and the double-sided fixing structure is integrally formed.

Optionally, the double-sided fixing structure further includes a first limiting plate, a second limiting plate, a third limiting plate, and a fourth limiting plate; the second limiting plate is arranged opposite to the first limiting plate; the first limiting plate and the second limiting plate are respectively and vertically arranged on two side edges of one surface of the spacing plate to form the first limiting groove; the fourth limiting plate is arranged opposite to the third limiting plate; the third limiting plate and the fourth limiting plate are respectively and vertically arranged on two side edges of the other surface of the spacing plate to form the second limiting groove; the first limiting groove and the second limiting groove are through grooves; the first limiting groove and the second limiting groove are through grooves, and the first print circuit board passes through the first limiting groove and is limited and fixed within the first limiting groove; the second print circuit board passes through the second limiting groove and is limited and fixed within the second limiting groove.

Optionally, the top of the first limiting plate away from the spacing plate is provided with a limiting protrusion extending towards the second limiting plate; the top of the second limiting plate away from the spacing plate is provided with a limiting protrusion extending towards the first limiting plate; the top of the third limiting plate away from the spacing plate is provided with a limiting protrusion extending towards the fourth limiting plate; and the top of the fourth limiting plate away from the spacing plate is provided with a limiting protrusion extending towards the third limiting plate.

Optionally, the first display screen is layered on the second display screen, a plurality of first chip on films are spaced between the first print circuit board and the first display screen, and a plurality of second chip on films are spaced between the second print circuit board and the second display screen; the number of the first chip on films is equal to that of the second chip on films, the second chip on films are aligned with the first chip on films up and down, and a plurality of the fixing structures are respectively arranged between two adjacent first chip on films.

Optionally, the distance between the first display screen and the second display screen is equal to the thickness of the double-sided fixing structure.

Optionally, the length of the limiting protrusion ranges from 0.5 mm to 5 mm.

The present application also discloses a dual-layer display assembly including a first display screen, a second display, a first print circuit board, a second print circuit board and a double-sided fixing structure; the second display screen arranged in layers with the first display screen; the first print circuit board connected to the first display screen and configured for driving the first display screen, the second print circuit board connected to the second display screen and configured for driving the second display screen, and the second print circuit board is arranged in parallel with the first print circuit board; the double-sided fixing structure arranged between the first print circuit board and the second print circuit board, connecting and fixing the first print circuit board and the second print circuit board; the double-sided fixing structure includes a first limiting groove, a spacing plate and a second limiting groove; the first limiting groove includes a first limiting plate and a second limiting plate; the second limiting plate arranged opposite to the first limiting plate; the first limiting plate and the second limiting plate are respectively and vertically arranged on two side edges of the spacing plate; the top of the first limiting plate away from the spacing plate is provided with a limiting protrusion extending towards the second limiting plate; the top of the second limiting plate away from the spacing plate is provided with a limiting protrusion extending towards the first limiting plate; the second limiting groove includes a third limiting plate and a fourth limiting plate; the fourth limiting plate arranged opposite to the third limiting plate; the third limiting plate and the fourth limiting plate are respectively and vertically arranged on two side edges of the spacing plate; the top of the third limiting plate away from the spacing plate is provided with a limiting protrusion extending towards the fourth limiting plate; and the top of the fourth limiting plate away from the spacing plate is provided with a limiting protrusion extending towards the third limiting plate; each of the limiting protrusions is integrally formed with the corresponding first limiting plate, the corresponding second limiting plate, the corresponding third limiting plate and the corresponding fourth limiting plate; the first limiting groove and the second limiting groove are through grooves, and the first print circuit board passes through the first limiting groove and is limited and fixed within the first limiting groove; the second print circuit board passes through the second limiting groove and is limited and fixed within the second limiting groove; the double-sided fixing structure is a flexible plastic structure.

The present application also discloses a display device, including the dual-layer display assembly as described above.

Relative to the solution that only one print circuit board can be adsorbed with the another print circuit board being in a drooping state during adhesive dispensing, the present application provides a fixing structure to fix the first print circuit board and the second print circuit board to which the first display screen and the second display screen correspond respectively. Placing a fixing structure between two active print circuit boards can guarantee the integral and stability of the print circuit boards, avoiding the occurrence of breakages of pins or terminals of the first print circuit board or the second print circuit board during transferring.

BRIEF DESCRIPTION OF DRAWINGS

The accompanying drawings, which are included to provide a further understanding of embodiments of the present application and constitute a part of the specification, illustrate embodiments of the application and, together with the text description, explain the principles of the application. Obviously, the drawings in the following description are merely some embodiments of the present application, and those skilled in the art can obtain other drawings according to the drawings without any inventive labor. In the drawings.

DETAILED DESCRIPTION OF EMBODIMENTS

It should be understood that the terms and specific structures and functional details disclosed are merely exemplary for the purpose of describing specific embodiments. However, the present application may be embodied in many alternative forms and should not be construed as being limited to the embodiments set forth herein.

In the description of the present application, the terms "first" and "second" are only for the purpose of description and cannot be construed to indicate relative importance or imply an indication of the number of technical features indicated. Therefore, unless otherwise stated, a feature defined as "first" and "second" may explicitly or implicitly include one or more of the features; "multiple" means two or more. The term "include" and any variations thereof are intended to be inclusive in a non-closed manner, that is, the presence or addition of one or more other features, integers, steps, operations, units, components and/or combinations thereof may be possible.

In addition, the terms "center", "horizontally", "up", "down", "left", "right", "vertical", "horizontal", "top", "bottom", "inner", "outer" and the like for indicating an orientation or positional relationship are based on the description of the orientation or relative positional relationship shown in the accompanying drawings, and are only simplified description facilitating description of the application, and are not intended to indicate that the device or element referred to must have a particular orientation, be configured and operated in a particular orientation, and therefore cannot be construed as limiting the present application.

In addition, unless expressly specified and defined otherwise, the terms "mount", "attach" and "connect" are to be understood broadly, for example, it can be a fixed connection, a detachable connection, or an integral connection; it can be an either mechanical connection or an electrical connection; it can be a direct connection or an indirect connection through an intermediate medium, or an internal connection between two elements. For those skilled in the art, the specific meaning of the above terms in this application can be understood according to the specific circumstances.

The present application will now be described in details by reference to the accompanying drawings and optional embodiments.

Figure 1:
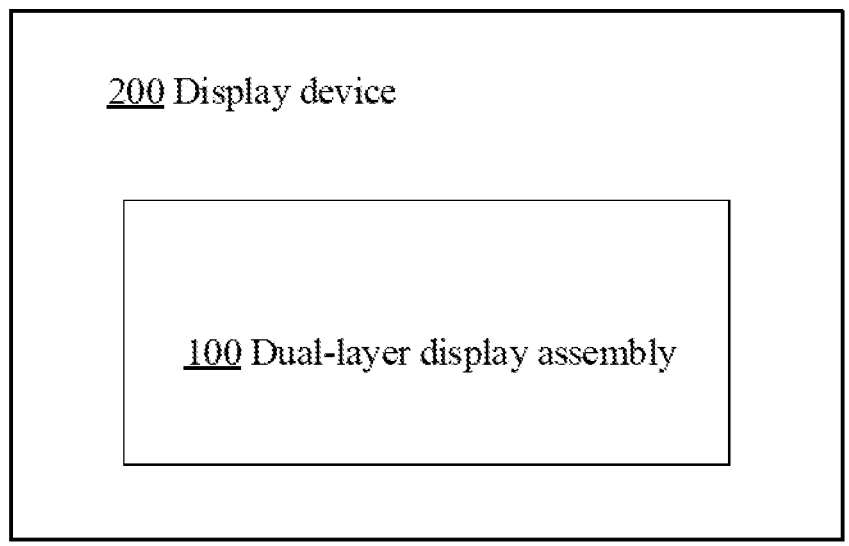
FIG. 1 is a schematic diagram of a display device according to an embodiment of the present application.
Figure 2:
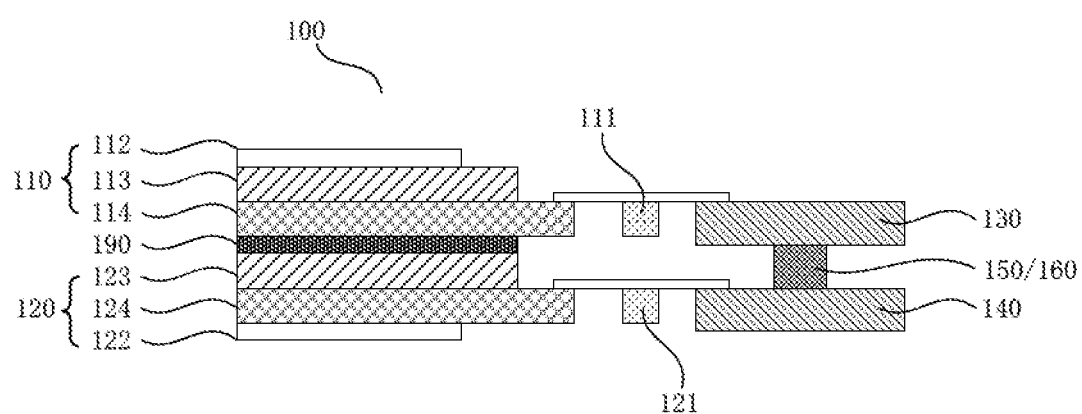
FIG. 2 is a schematic diagram of a dual-layer display assembly according to an embodiment of the present application.

As shown in FIGS. 1 and 2, as an embodiment of the present application, a display device 200 is disclosed, and the display device 200 includes a dual-layer display assembly 100. The dual-layer display assembly 100 includes a first display screen 110 and a second display screen 120 arranged in layers with the first display screen 110, where the first display screen 110 includes a first polarizer 112, a first color film substrate 113 and a first array substrate 114, the second display screen 120 is disposed under the first display screen 110 and includes a second color film substrate 124, a second array substrate 123 and a second polarizer 122, the dual-layer display assembly 100 further includes a dispensed adhesive 190 for bonding the first array substrate 114 to the second color film substrate 124 to form the dual-layer display assembly 100, and the dispensed adhesive 190 can be used for integrally bonding the first display screen 110 and the second display screen 120 or bonding the periphery of the first display screen 110 and the periphery of the second display screen 120.

Most importantly, the dual-layer display assembly 100 further includes a first print circuit board 130 connected to the first display screen 110 and configured for driving the first display screen 110; a second print circuit board 140 connected to the second display screen 120 and configured for driving the second display screen 120, and a fixing structure 150 connecting and fixing the first print circuit board 130 and the second print circuit board 140; the first print circuit board 130 and the second print circuit board 140 are arranged in parallel, and the fixing structure 150 is arranged between the first print circuit board 130 and the second print circuit board 140 to connect and fix the first print circuit board 130 and the second print circuit board 140, so as to fix both of the first print circuit boards, thereby solving the problem that one side of one of the first print circuit board 130 and the second print circuit board 140 is still in a free state after the dispensed adhesive 190 is fixed, thus avoiding the phenomenon that one of the first print circuit board 130 and the second print circuit board 140 which is not adsorbed by the production line droops, and the occurrence of the breakages of pins or terminals of the first print circuit board or the second print circuit board.

Specifically, the fixing structure 150 includes a double-sided back adhesive thermal paste 160, the double-sided back adhesive thermal paste 160 adheres the first print circuit board 130 and the second print circuit board 140 to fix them. Fixing the two PCBs, that is, the first print circuit board 130 and the second print circuit board 140, by the double-sided back adhesive thermal paste therebetween not only fixes the first print circuit board 130 and the second print circuit board 140 but also functions to conduct the heat.

In practical applications, the first display screen 110 is layered on the second display screen 120, or the first display screen 110 and the second display screen 120 are juxtaposed to perform operations on a production line, a plurality of first chip on films 111 are disposed between the first print circuit board and the first display screen 110, a plurality of second chip on films 121 are disposed between the second print circuit board 140 and the second display screen 120, each of the second chip on films 121 is correspondingly disposed on an orthographic projection of each of the first chip on films 111, a plurality of the fixing structures 150 are disposed between two adjacent first chip on films 111, and the number of the double-sided back adhesive thermal paste 160 can be determined based on the size of the plate and the actual number of the first chip on films 111 and the second chip on films 112.

In order to ensure the uniformity of the dual-layer display screen, the distance between the first display screen 110 and the second display screen 120 is equal to the thickness of the double-sided fixing structure 170, which facilitates the sequentially assemble and transport, and prevents the double-sided fixing structure 170 from protruding out of the display screen, causing collisions during the transportation, thereby avoiding impacts on fixing the first print circuit board 130 and the second print circuit board 140 through the double-sided back adhesive thermal paste 160.

Figure 3:
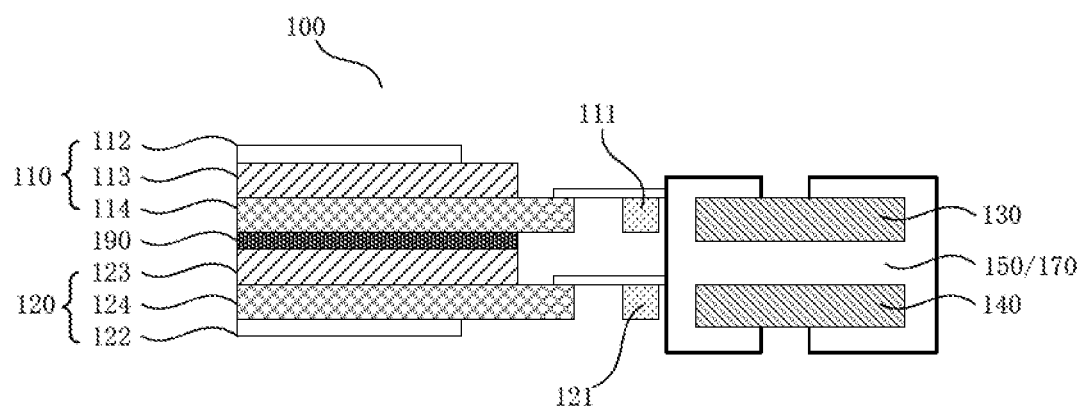
FIG. 3 is a schematic diagram of a dual-layer display assembly according to another embodiment of the present application.
Figure 4:
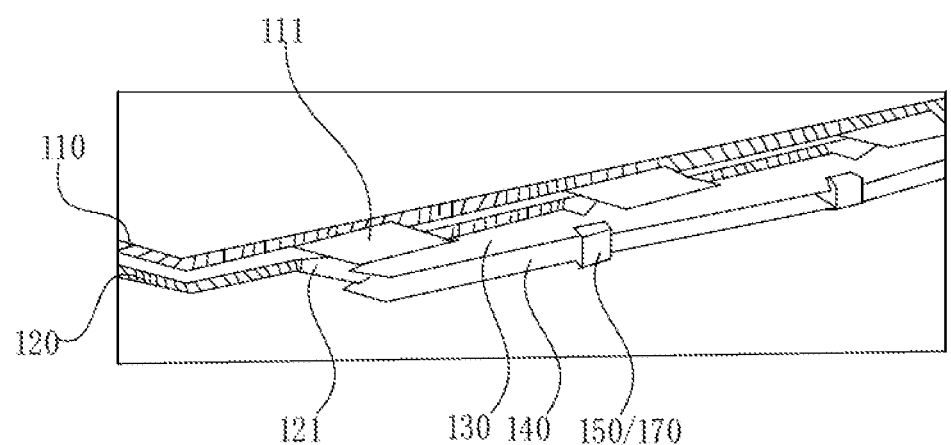
FIG. 4 is a schematic diagram of a dual-layer display assembly according to an embodiment of the present application.
Figure 5:
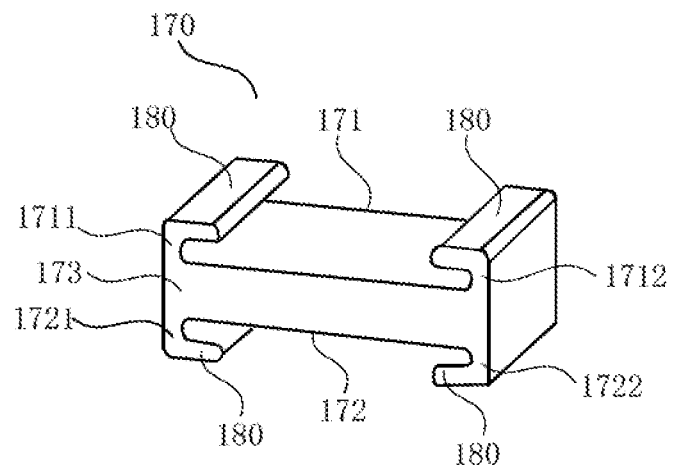
FIG. 5 is a schematic diagram of a double-sided fixing structure of a dual-layer display assembly according to an embodiment of the present application.

As shown in FIGS. 3 to 5, as another embodiment of the present application, unlike the above-mentioned embodiments, the fixing structure 150 includes a double-sided fixing structure 170 including a first limiting groove 171, a second limiting groove 172 and a spacing plate 173; the first limiting groove 171 limits and fixes the first print circuit board 130; the second limiting groove 172 limits and fixes the second print circuit board 140; the spacing plate 173 is arranged between the first and second limiting grooves 171 and 172; the first limiting groove 171, the second limiting groove 172 and the spacing plate 173 are integrally formed. The first print circuit board 130 and the second print circuit board 140 are respectively limited by the first limiting groove 171 and the second limiting groove 172, so that the condition that any one of the print circuit boards drops can be prevented without changing the production, only one of the print circuit boards needs to be adsorbed when dispensing adhesive, and due to the existence of the two limiting grooves, the other print circuit board can also be adsorbed, thus avoiding the problems of drooping, shaking and the like.

If the first display screen 110 is over the second display screen 120 during adhesive dispensing, the first print circuit board 130 on the first limiting groove 171 can be adsorbed by the production line, and then a second limiting groove 172 with an upward opening is required for fixing the second print circuit board 140; if the opening directions of the first position-limiting groove 171 and the second position-limiting groove 172 are the same, the second position-limiting groove 172 can be regarded as a through groove, so that the second print circuit board 140 can be limited to move within the through groove.

Further, the first limiting groove 171 includes a first limiting plate 1711 and a second limiting plate 1712 arranged opposite to the first limiting plate 1711; the first limit plate 1711 and the second limit plate 1712 are respectively and vertically arranged on two side edges of the spacing plate 173; the top of the first limiting plate 1711 away from the spacing plate 173 is provided with a limiting protrusion 180 extending towards the second limiting plate 1712; the top of the second limiting plate 1712 away from the spacing plate 173 is provided with a limiting protrusion extending towards the first limiting plate 1711; the two limiting protrusions 180 are provided to prevent the first print circuit board 130 from sliding out of the opening of the first limiting groove 171.

Correspondingly, the second limiting groove 172 includes a third limiting plate 1721 and a fourth limiting plate 1722 arranged opposite to the third limiting plate 1721; the third limiting plate 1721 and the fourth limiting plate 1722 are respectively and vertically arranged on two sides of the spacing plate 173; the top of the third limiting plate 1721 away from the spacing plate 173 is provided with a limiting protrusion 180 extending towards the fourth limiting plate 1722; and the top of the fourth limiting plate 1722 away from the spacing plate 173 is provided with a limiting protrusion 180 extending towards the third limiting plate 1721; the two limiting protrusions are provided to prevent the second print circuit board from sliding out of the first limiting groove 172.

Generally, the first limiting groove 171 and the second limiting groove 172 are through grooves, and the first print circuit board 130 passes through the first limiting groove 171 and is limited and fixed within the first limiting groove 171; the second print circuit board 140 passes through the second limiting groove 172 and is limited and fixed within the second limiting groove 172, and placing a double-sided fixing structure 170 between the two active PCBs can guarantee the integral and stability of the PCBs.

The first limiting groove 171 and the second limiting groove 172 are through grooves, therefore the fixing structure may be provided as small as a clip that fixes the two boards together by only clipping a portion thereof, instead of mounting the entire print circuit board into a limiting groove. In this way, while improving the condition that the first print circuit board 130 or the second print circuit board 140 being drooping, space occupy and the cost are reduced moreover.

In the manufacturing of the double-sided fixing structure 170, the height of the double-sided fixing structures 170 is determined by the actual thickness of the glass and the thickness of the dispensing adhesive 190, the number of the double-sided fixing structure 170 is determined by the actual number of COFs, and the double-sided fixing structures 170 are placed in the gap between the two COFs; each of the limiting protrusions 180 of the double-sided fixing structure 170 is integrally formed with the corresponding first limiting plate 1711, second limiting plate 1712, third limiting plate 1721 and fourth limiting plate 1722, so that the whole double-sided fixing structure 170 is better in stability; the double-sided fixing structure of the present application can use a buckle to fix and connect the grooves, the first limiting groove 171 and the second limiting groove can be separately manufactured and then fixed by setting the buckle on the spacing plate 173, thereby fixing the first print circuit board 130 and the second print circuit board 140.

In addition, since many important components are disposed on the print circuit board, the length of the limiting protrusion 180 ranges from 0.5 mm to 5 mm, that is, the length of the limiting protrusion extending from each limiting plate to the limiting plate on the corresponding side ranges from 0.5 mm to 5 mm, which means the length is limited at the edge of the print circuit board, so that some protruding components on the print circuit board can be prevented from being collided with the limiting protrusion 180, which is further provided with an avoiding notch and each corner thereof is in an arc structure, so as to prevent collision with components on the first print circuit board 130 or the second print circuit board 140, and the limiting effect may be minus if the length is shorter than 0.5 mm, and the occupied area is too large if the length is longer than 5 mm, which may affect the distribution of components on the first print circuit board 130 or the second print circuit board 140 or damage the components.

As shown in FIG. 4, as another embodiment of the present application, a dual-layer display assembly 100 is disclosed, which includes a first display screen 110, a second display screen 120 arranged in layers with the first display screen 110, a first print circuit board 130 connected to the first display screen 110 and configured for driving the first display screen 110, a second print circuit board 140 connected to the second display screen 120 and configured for driving the second display screen 120, and a double-sided fixing structure 170, where the second print circuit board 140 and the first print circuit board 130 are arranged in parallel; the double-sided fixing structure 170 is arranged between the first print circuit board 130 and the second print circuit board 140 so as to connect and fix the first print circuit board 130 and the second print circuit board 140; the double-sided fixing structure 170 includes a first limiting groove 171, a spacing plate 173, and a second limiting groove 172; the first print circuit board 130 and the second print circuit board 140 are fixed respectively through the first limiting groove 171 and the second limiting groove 172 in the double-sided fixing structure 170, so that the print circuit boards are prevented from drooping and dropping during the process of dispensing adhesive 190, and the double-sided fixing structure is integrally formed in order to improve the stability thereof.

Further, the first limiting groove 171 includes a first limiting plate 1711 and a second limiting plate 1712; the second limiting plate 1712 arranged opposite to the first limiting plate 1711; the first limit plate 1711 and the second limit plate 1712 are respectively and vertically arranged on two side edges of the spacing plate 173; the top of the first limiting plate 1711 away from the spacing plate 173 is provided with a limiting protrusion 180 extending towards the second limiting plate 1712; the top of the second limiting plate 1712 away from the spacing plate 173 is provided with a limiting protrusion 180 extending towards the first limiting plate 1711, where the first limiting plate 1711, the second limiting plate 1712 and the spacing plate 173 are integrally formed;

the second limit groove 172 includes a third limiting plate 1721 and a fourth limiting plate 1722; the fourth limiting plate 1722 arranged opposite to the third limiting plate 1721; the third limiting plate 1721 and the fourth limiting plate 1722 are respectively and vertically arranged on two sides of the spacing plate 173; the top of the third limiting plate 1721 away from the spacing plate 173 is provided with a limiting protrusion 180 extending towards the fourth limiting plate 1722; the top of the fourth limiting plate 1722 away from the spacing plate 173 is provided with a limiting protrusion 180 extending towards the third limiting plate 1721; each of the limiting protrusions 180 of the double-sided fixing structure 170 is integrally formed with the corresponding first limiting plate 1711, second limiting plate 1712, third limiting plate 1721 and fourth limiting plate 1722; the first limiting groove 171 and the second limiting groove 172 are through grooves, and the first print circuit board 130 passes through the first limiting groove 171 and is limited and fixed within the first limiting groove 171; the second print circuit board 140 passes through the second limiting groove 172 and is limited and fixed within the second limiting groove 172; the double-sided fixing structure 170 is a flexible plastic structure.

The first limiting groove 171 and the second limiting groove 172 are further provided with limiting protrusions 180 to prevent the first print circuit board 130 or the second print circuit board 140 from sliding out of the openings of the limiting grooves, and the double-sided fixing structure 170 is a flexible plastic structure and is retractable, the width of the fixing structure 150 can be set to be equal to the width of the print circuit board, and then the first print circuit board 130 or the second print circuit board 140 can directly pass through the limiting grooves and be clamped between the two corresponding limiting plates.

As another embodiment of the present application, the double-sided back adhesive thermal paste and the double-sided fixing structure as described above may be used alternatively, for example, the double-sided fixing structure may be used at both ends of the first print circuit board 130 and the second print circuit board 140 aligned up and down, and the double-sided back adhesive thermal paste may be used at the middle portion thereof, so as to prevent the print circuit board from being too long and adverse to the fixation of the double-sided fixing structure.

Figure 6:
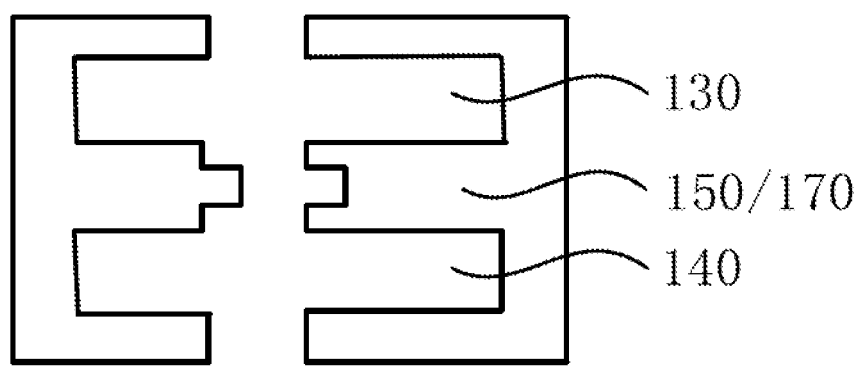
FIG. 6 is a schematic diagram of a double-sided fixing structure of a dual-layer display assembly according to another embodiment of the present application.

As shown in FIG. 6, the double-sided fixing structure 170 is detachable, dividing the double-sided fixing structure 170 into two parts, and the fixing is based on arranging grooves and protrusions at corresponding positions on the spacing plate 173, so that the first print circuit board 130 and the second print circuit board can be clamped on their two sides directly in case they are large and long, making the fixing very convenient.

The above content is a further detailed description of the present application in conjunction with specific, optional embodiments, and it is not to be construed that specific embodiments of the present application are limited to these descriptions. For those of ordinary skill in the art to which this application belongs, a number of simple derivations or substitutions may be made without departing from the spirit of this application, all of which shall be deemed to fall within the scope of this application.

What is claimed is:

1. A dual-layer display assembly, comprising:
a first display screen;
a second display screen arranged in layers with the first display screen;
a first print circuit board connected to the first display screen and configured for driving the first display screen;
a second print circuit board connected to the second display screen and configured for driving the second display screen; and
a fixing structure connecting and fixing the first print circuit board and the second print circuit board;
wherein the first print circuit board and the second print circuit board are arranged in parallel, and the fixing structure is arranged between the first print circuit board and the second print circuit board to connect and fix the first print circuit board and the second print circuit board;
wherein the fixing structure comprises a double-sided fixing structure, the double-sided fixing structure comprises:
a first limiting groove configured for limiting and fixing the first print circuit board;
a second limiting groove configured for limiting and fixing the second print circuit board; and
a spacing plate arranged between the first limiting groove and the second limiting groove;
wherein the double-sided fixing structure is integrally formed.

2. The dual-layer display assembly according to claim 1, wherein the double-sided fixing structure further comprises:
a first limiting plate; and
a second limiting plate arranged opposite to the first limiting plate;
wherein the first limiting plate and the second limiting plate are respectively and vertically arranged on two side edges of one surface of the spacing plate to form the first limiting groove;
wherein the double-sided fixing structure further comprises:
a third limiting plate; and
a fourth limiting plate arranged opposite to the third limiting plate;
wherein the third limiting plate and the fourth limiting plate are respectively and vertically arranged on two side edges of the other surface of the spacing plate to form the second limiting groove;
the first limiting groove and the second limiting groove are through grooves, and the first print circuit board passes through the first limiting groove and is limited and fixed within the first limiting groove; the second print circuit board passes through the second limiting groove and is limited and fixed within the second limiting groove.

3. The dual-layer display assembly according to claim 2, wherein the top of the first limiting plate away from the spacing plate is provided with a limiting protrusion extending towards the second limiting plate; the top of the second limiting plate away from the spacing plate is provided with a limiting protrusion extending towards the first limiting plate;
the top of the third limiting plate away from the spacing plate is provided with a limiting protrusion extending towards the fourth limiting plate; and the top of the fourth limiting plate away from the spacing plate is provided with a limiting protrusion extending towards the third limiting plate.

4. The dual-layer display assembly according to claim 1, wherein the first display screen is layered on the second display screen, a plurality of first chip on films are spaced between the first print circuit board and the first display screen, and a plurality of second chip on films are spaced between the second print circuit board and the second display screen; the number of the first chip on films is equal to that of the second chip on films, the second chip on films are aligned with the first chip on films up and down, and a plurality of the fixing structures are respectively arranged between the adjacent first chip on films.

5. The dual-layer display assembly according to claim 4, wherein the distance between the first display screen and the second display screen is equal to the thickness of the double-sided fixing structure.

6. The dual-layer display assembly according to claim 3, wherein the length of the limiting protrusion ranges from 0.5 mm to 5 mm.

7. The dual-layer display assembly according to claim 1, wherein the first display screen comprises a first polarizer, a first color filter substrate, and a first array substrate, the second display screen is disposed under the first display screen and comprises a second color filter substrate, a second array substrate, and a second polarizer, and the dual-layer display assembly further comprises a dispensed adhesive bonding the first array substrate to the second color filter substrate to form the dual-layer display assembly.

8. The dual-layer display assembly according to claim 2, wherein the first and second limiting grooves are integrally formed with the spacing plate.

9. A dual-layer display assembly, comprising:
a first display screen;
a second display screen arranged in layers with the first display screen;
a first print circuit board connected to the first display screen and configured for driving the first display screen;
a second print circuit board connected to the second display screen and configured for driving the second display screen, wherein the second print circuit board is arranged in parallel with the first print circuit board; and
a double-sided fixing structure arranged between the first print circuit board and the second print circuit board, connecting and fixing the first print circuit board and the second print circuit board;
the double-sided fixing structure comprises a first limiting groove, a spacing plate and a second limiting groove;
the first limiting groove comprises:
a first limiting plate; and
a second limiting plate arranged opposite to the first limiting plate;

wherein the first limiting plate and the second limiting plate are respectively and vertically arranged on two side edges of the spacing plate;

the top of the first limiting plate away from the spacing plate is provided with a limiting protrusion extending towards the second limiting plate; and the top of the second limiting plate away from the spacing plate is provided with a limiting protrusion extending towards the first limiting plate;

the second limiting groove comprises:

a third limiting plate; and a fourth limiting plate arranged opposite to the third limiting plate;

wherein the third limiting plate and the fourth limiting plate are respectively and vertically arranged on two side edges of the spacing plate;

the top of the third limiting plate away from the spacing plate is provided with a limiting protrusion extending towards the fourth limiting plate; and the top of the fourth limiting plate away from the spacing plate is provided with a limiting protrusion extending towards the third limiting plate;

each of the limiting protrusions is integrally formed with the corresponding first limiting plate, the corresponding second limiting plate, the corresponding third limiting plate and the corresponding fourth limiting plate;

the first limiting groove and the second limiting groove are through grooves, and the first print circuit board passes through the first limiting groove and is limited and fixed within the first limiting groove; the second print circuit board passes through the second limiting groove and is limited and fixed within the second limiting groove;

the double-sided fixing structure is a flexible plastic structure.

10. A display device comprising a dual-layer display assembly, the dual-layer display assembly comprises:

a first display screen;

a second display screen arranged in layers with the first display screen;

a first print circuit board connected to the first display screen and configured for driving the first display screen;

a second print circuit board connected to the second display screen and configured for driving the second display screen; and a fixing structure connecting and fixing the first print circuit board and the second print circuit board;

wherein the first print circuit board and the second print circuit board are arranged in parallel, and the fixing structure is arranged between the first print circuit board and the second print circuit board to connect and fix the first print circuit board and the second print circuit board;

wherein the fixing structure comprises a double-sided fixing structure, the double-sided fixing structure comprises:

a first limiting groove configured for limiting and fixing the first print circuit board;

a second limiting groove configured for limiting and fixing the second print circuit board; and a spacing plate arranged between the first limiting groove and the second limiting groove;

wherein the double-sided fixing structure is integrally formed.

11. The display device according to claim 10, wherein the first display screen is layered on the second display screen, a plurality of first chip on films are spaced between the first print circuit board and the first display screen, and a plurality of second chip on films are spaced between the second print circuit board and the second display screen; the number of the first chip on films is equal to that of the second chip on films, the second chip on films are aligned with the first chip on films up and down, and a plurality of the fixing structures are respectively arranged between adjacent first chip on films.

12. The display device according to claim 10, wherein the first display screen comprises a first polarizer, a first color filter substrate, and a first array substrate, the second display screen is disposed under the first display screen and comprises a second color filter substrate, a second array substrate, and a second polarizer, and the dual-layer display assembly further comprises a dispensed adhesive bonding the first array substrate to the second color filter substrate to form the dual-layer display assembly; and the distance between the first display screen and the second display screen is equal to the thickness of the double-sided fixing structure.

* * * * *